United States Patent
Howard et al.

(10) Patent No.: US 6,861,678 B2
(45) Date of Patent: Mar. 1, 2005

(54) DOUBLE DIFFUSED VERTICAL JFET

(75) Inventors: Gregory E. Howard, Dallas, TX (US); Leland S. Swanson, McKinney, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 10/623,230

(22) Filed: Jul. 18, 2003

(65) Prior Publication Data

US 2005/0012111 A1 Jan. 20, 2005

(51) Int. Cl.$^7$ ........................ H01L 29/74; H01L 31/111
(52) U.S. Cl. ........................................ 257/134; 257/135
(58) Field of Search ........................ 257/134, 135, 257/133, 302

(56) References Cited

U.S. PATENT DOCUMENTS 6,008,520 A * 12/1999 Darwish et al. ............ 257/330
6,084,254 A * 7/2000 Kim ........................... 257/134

OTHER PUBLICATIONS

Pending U.S. Application No. 10/614,840 (TI–35193) Howard et al. "Implant–Controlled–Channel Vertical JFET".

Pending U.S. Application No. 10/678,028 (TI–33654), Pendharker et all "A Low Noise Vertical Variable Gate Control Voltage JFET Device in a BICMOS Process & Methods to Build this Device".

* cited by examiner

*Primary Examiner*—Phat X. Cao
*Assistant Examiner*—Theresa T. Doan
(74) *Attorney, Agent, or Firm*—Yingsheng Tung; Wade James Brady, III; Frederick J. Telecky, Jr.

(57) ABSTRACT

We disclose the structure of a JFET device, the method of making the device and the operation of the device. The device is built near the top of a substrate. It has a buried layer that is electrically communicable to a drain terminal. It has a body region above the buried layer. A portion of the body region contacts a gate region connected to a gate terminal. The device has a channel region, of which the length spans the distance between the buried layer and a source region, which projects upward from the channel region and is connected to a source terminal. The device current flows in the channel substantially perpendicularly to the top surface of the substrate.

21 Claims, 5 Drawing Sheets

DOUBLE DIFFUSED VERTICAL JFET

BACKGROUND OF THE INVENTION

This invention relates to semiconductor devices and particularly to an improved junction field effect transistor (JFET).

A conventional JFET is a three-terminal semiconductor device in which a current flows substantially parallel to the top surface of the semiconductor chip and the flow is controlled by a vertical electric field, as shown in FIGS. 1a, 1b, and 1c. It can be used as a current switch or a signal amplifier.

JFETs are known as unipolar transistors because the current is transported by carriers of one polarity, namely, the majority carriers. This is in contrast with bipolar junction transistor, in which both majority-and-minority-carrier currents are important.

A typical n-channel JFET fabricated by the standard planar process is shown in FIG. 1. FIG. 1a depicts an n-channel JFET of which the channel is a part of an epitaxial semiconductor layer. FIG. 1b depicts another n-channel JFET of which the channel is formed with a double-diffusion technique in a semiconductor substrate. FIG. 1c is a schematic representation of the JFETs.

The body of the JFET comprises a lightly doped n-type channel sandwiched between two heavily doped $p^+$-gate regions. In FIG. 1a, the lower $p^+$ region is the substrate, and the upper $p^+$ region is a portion of the silicon epitaxial layer into which boron atoms are diffused. The two $p^+$ regions may be connected either internally or externally to form the gate terminal. Ohmic contacts are attached to the two ends of the channel to form the drain and source terminals through which the channel current flows. Alternatively, as illustrated in FIG. 1b, a JFET may be fabricated by a double-diffusion technique where the channel is formed by diffusing n-type dopant into the substrate. In both cases, the channel and the gate regions run substantially parallel the top surface of the substrate, so does the current flow in the channel.

When a JFET operates as a switch, without a gate bias voltage, the charge carriers flow in the channel region between the source and the drain terminals. This is the ON state. To reach the OFF state, a reverse-biasing gate voltage is applied to deplete the charge carriers and to "pinch off" the channel. The reverse bias voltage applied across the gate-channel junctions depletes free carriers from the channel and produces space-charge regions extending into the channel.

With a gate voltage set between ON and OFF levels, the cross-sectional area of the channel and the channel resistance can be varied. Thus the current flow between the source and the drain is modulated by the gate voltage.

An important figure of merit of a JFET is its cutoff frequency ($f_{co}$) which can be represented mathematically as follows:

$$f_{co} \leq q\alpha^2 \mu_n N_d/(4\pi k\epsilon_o L^2),$$

where q is the electric charge of the charge carriers, α is the channel width, $\mu_n$ is the mobility of the charge carriers, $N_d$ is the doping concentration in the channel, k and $\epsilon_o$ are the dielectric constant of the semiconductor material and the electrical permittivity of the free space respectively, and L is the channel length.

Another important figure of merit of a JFET is the noise figure. At lower frequencies the dominant noise source in a transistor is due to the interaction of the current flow and the surface region that gives rise to the 1/f noise spectrum.

This invention provides a JFET device that has superior $f_{co}$ and 1/f performance over conventional JFETs and a process of making the device.

DESCRIPTION OF THE PREFERRED EMBODIMENT

Figure 2:
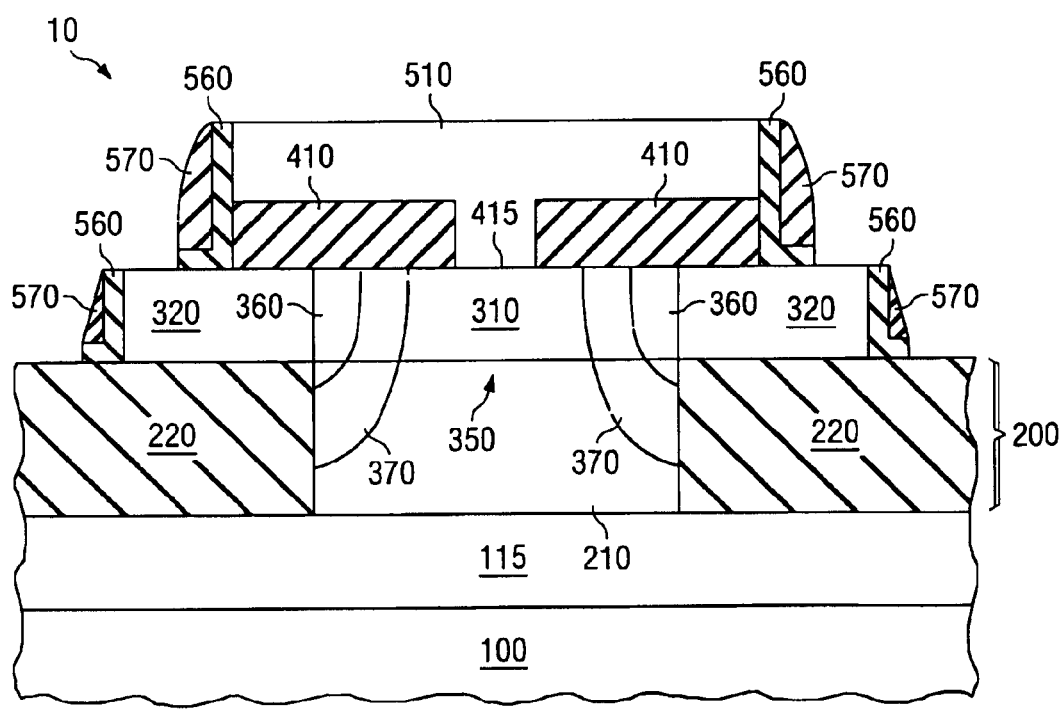
FIG. 2 is a partial sectional depiction of a semiconductor substrate with a JFET embodying the invention built in it.

In FIG. 2, an n-channel JFET 10 is shown as a three-terminal device, fabricated near the top surface of a semiconductor substrate. The semiconductor material in the preferred embodiment is silicon. A JFET embodying this invention can also be fabricated in other semiconductor materials such as germanium, germanium-silicon, gallium arsenide, or other compound material. FIG. 2 depicts a JFET built in a bulk silicon substrate. A JFET embodying this invention can also be fabricated in a substrate of semiconductor-on-insulator such as SIMOX, silicon-on-sapphire, or in bonded wafer. FIG. 2 depicts an n-channel JFET. A JFET embodying this invention can also be implemented as a p-channel JFET. A JFET may also be one device in an integrated circuit that includes CMOS and Bipolar circuit elements, and passive circuit components.

The substrate 100 may be either n-type or p-type. In a typical integrated circuit fabricated by a BiCMOS process, the substrate 100 would be a lightly doped, p-type crystalline silicon material. Over a portion of the substrate 100 is an n-type layer 115 of low resistivity that constitutes the drain portion of the JFET. In a BiCMOS structure, a region commonly referred to as "a buried layer" fits this requirement.

Over a portion of the buried layer 115 is a layer 200. Layer 200 includes several regions of different materials. Among them, region 220 includes primarily dielectric material. In this embodiment, this material is silicon dioxide, fabricated with a STI technique. Region 220 may also be built with a LOCOS technique or other techniques well known in the art. Element 210 of layer 200 is substantially n-type monocrystalline silicon. It may be formed by an epitaxial technique.

Elements 320 are gate regions of the JFET, located above layer 200. In this embodiment, the gate regions are polycrystalline silicon, heavily doped with p-type dopant. The doping process includes two steps. One step involves a relative light boron implant followed by a diffusion to create a p-region 370 in the body region that includes regions 310 and 210. Another doping step is the heavier boron implant followed by diffusion, which forms a p-region 360. The light implant may correspond to a base implant in a BiCMOS flow and the heavy implant may correspond to the p-source/drain implant.

The double implant and diffusion forms a p-type region that defines within the body region an n-type channel region 350 that is confined laterally by the p-type region and the dielectric region 220 and longitudinally by the buried layer 115 and a source region 510. The formation of the channel region 350 is depicted more clearly in drawing FIGS. 3–6 and explained in more detail in later paragraphs.

The source region 510 in this embodiment includes polycrystalline. It makes contact to the channel region 350 through an opening 415 etched out from an insulating element 410 that comprises silicon dioxide and silicon nitride. In the preferred embodiment, there is an absence of native oxide between the source region 510 and the channel region 350 so the source region contacts the channel region and the silicon immediately above the channel region may retain the mono-crystalline structure within a short range. In another embodiment, minute oxide may exist in the vicinity of the opening 415 as result of chemical processes such as a wet chemical cleanup process. The source region 510 is heavily doped with phosphorus, arsenic, or other n-type dopants and it partially overhangs the gate regions 320 and is insulated from the gate region 320 by the dielectric elements 410, oxide elements 560 and nitride elements 570.

The edges of the source region 510 and the gate region 320 are bordered by what is known in the art as "side-wall" elements, which electrically insulate the source region from the gate region. The sidewall elements in this embodiment include silicon dioxide 560 and silicon nitride 570.

FIGS. 3 to 6 depict the formation of the channel portion of a JFET embodying this invention through a fabrication process. The complete fabrication of a functional JFET, in the context of an integrated circuit, involves many well-known processing steps in addition to those illustrated in the drawings. These well-known processing steps include creating a drain contact to the buried layer, a source contact to the source region, and a gate contact to the gate region, and wiring the contacts with metallic elements to connect the JFET to the other circuit elements of the integrated circuit.

Figure 3:
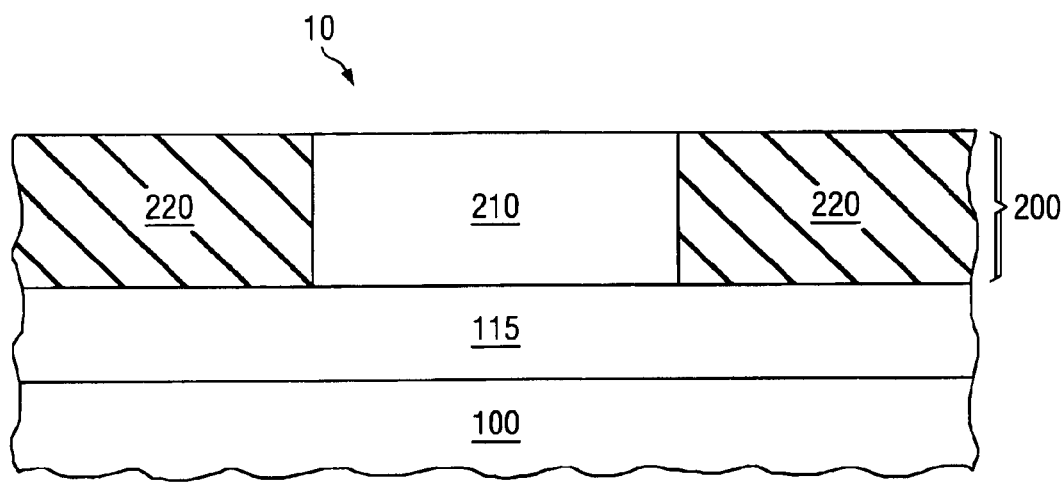
FIG. 3 is a cross-sectional depiction of a partially completed JFET 10 embodying this invention.

FIG. 3 depicts a cross-sectional view of a partially completed JFET 10 embodying this invention. Element 100 is a semiconductor substrate. In this embodiment, the semiconductor material is silicon. Other semiconductor materials suitable to implement this invention include germanium, silicon-germanium, silicon carbide, and gallium arsenide. In this embodiment, the silicon substrate is a bulk substrate. Other types of substrates suitable to implement this invention include silicon on insulator (SOI).

Substrate 100 may be doped with a p-type or an n-type dopant. The dopant concentration may vary from light to heavy as understood by a person with reasonable skill in the art of semiconductor processing.

Element 115 is a heavily doped semiconductor layer partially covering the substrate 100. In this embodiment, layer 115 is formed by an arsenic or phosphorus implant step followed by a anneal step. In the art of semiconductor processing, this heavily doped region is referred to as "a buried layer".

Layer 200 sits on top of the buried layer. In this embodiment, layer 200 includes a region of epitaxial, lightly doped, n-type, mono-crystalline silicon. The thickness of this epi-region may be between 2000 Å and 7000 Å, preferably about 5000 Å. This region may be doped in-situ or it may be doped with an arsenic or phosphorous implant with a dose between $5\times10^9$ to $5\times10^{11}$ ions/cm$^2$, to a dopant concentration of about $1\times10^{15}$ ions/cm$^3$.

Layer 200 also includes regions of dielectric material. The dielectric regions 220 are places in the layer 200 so the JFET is formed in a mono-crystalline silicon island 210 isolated from other elements in the silicon substrate. In this embodiment, the dielectric material is silicon dioxide and the technique with which the silicon dioxide regions are formed is referred to in the art as the shallow trench isolation (STI) technique.

Figure 4:
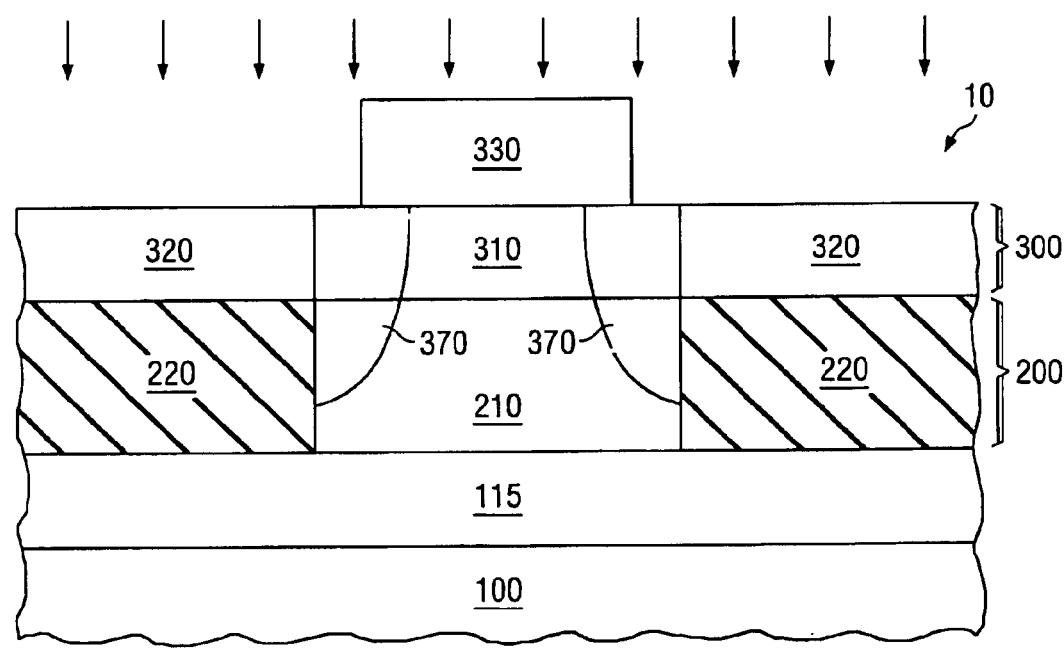
FIG. 4 is a cross-sectional depiction of a further partially completed JFET 10 embodying this invention.

FIG. 4 depicts a cross-sectional view of a further partially completed JFET 10. Features depicted in FIG. 4 include a layer element 300. In this embodiment, layer 300 is a lightly doped, n-type, silicon layer. The thickness of layer 300 may be between 1000 Å and 3000 Å, preferably 2000 Å. Layer 300 may be doped in-situ or it maybe doped with a boron implant with dose between $5\times10^9$ and $5\times10^{11}$ ions/cm$^2$, preferably to a dopant concentration of about $1\times10^{15}$ ions/cm$^3$. The portion of layer 300 embodiment, the semiconductor material is silicon. Other semiconductor materials suitable to implement this invention include germanium, silicon-germanium, silicon carbide, and gallium arsenide. In this embodiment, the silicon substrate is a bulk substrate. Other types of substrates suitable to implement this invention include silicon on insulator (SOI).

Substrate 100 may be doped with a p-type or an n-type dopant. The dopant concentration may vary from light to heavy as understood by a person with reasonable skill in the art of semiconductor processing.

Element 115 is a heavily doped semiconductor layer partially covering the substrate 100. In this embodiment, layer 115 is formed by an arsenic or phosphorus implant step followed by a anneal step. In the art of semiconductor processing, this heavily doped region is referred to as "a buried layer".

Layer 200 sits on top of the buried layer. In this embodiment, layer 200 includes a region of epitaxial, lightly doped, n-type, mono-crystalline silicon. The thickness of this epi-region may be between 2000 Å and 7000 Å, preferably about 5000 Å. This region may be doped in-situ or it may be doped with an arsenic or phosphorous implant with a dose between $5\times10^9$ to $5\times10^{11}$ ions/cm$^2$, to a dopant concentration of about $1\times10^{15}$ ions/cm$^3$.

Layer 200 also includes regions of dielectric material. The dielectric regions 220 are places in the layer 200 so the JFET is formed in a mono-crystalline silicon island 210 isolated from other elements in the silicon substrate. In this embodiment, the dielectric material is silicon dioxide and the technique with which the silicon dioxide regions are formed is referred to in the art as the shallow trench isolation (STI) technique.

FIG. 4 depicts a cross-sectional view of a further partially completed JFET 10. Features depicted in FIG. 4 include a layer element 300. In this embodiment, layer 300 is a lightly doped, n-type, silicon layer. The thickness of layer 300 may be between 1000 Å and 3000 Å, preferably 2000 Å. Layer 300 may be doped in-situ or it maybe doped with a boron implant with dose between $5\times10^9$ and $5\times10^{11}$ ions/cm$^2$, preferably to a dopant concentration of about $1\times10^{15}$ ions/cm$^3$. The portion of layer 300 that is in contact with element 210 is mono-crystalline while the portions that contacts elements 220 are poly-crystalline.

Also depicted in FIG. 4 is a photoresist pattern 330. This pattern covers at least a portion of the region 310 and uncovers the regions 320, which are doped and converted from lightly n-type to p-type. In a BiCMOS process flow, this doping step may correspond to the base implant step. The implant step is followed by a high temperature anneal step, which drives the fast diffusing p-type dopant, boron in this embodiment, from the polysilicon regions 320 into a portion 370 of the mono-crystalline silicon regions 310 and 210.

Figure 5:
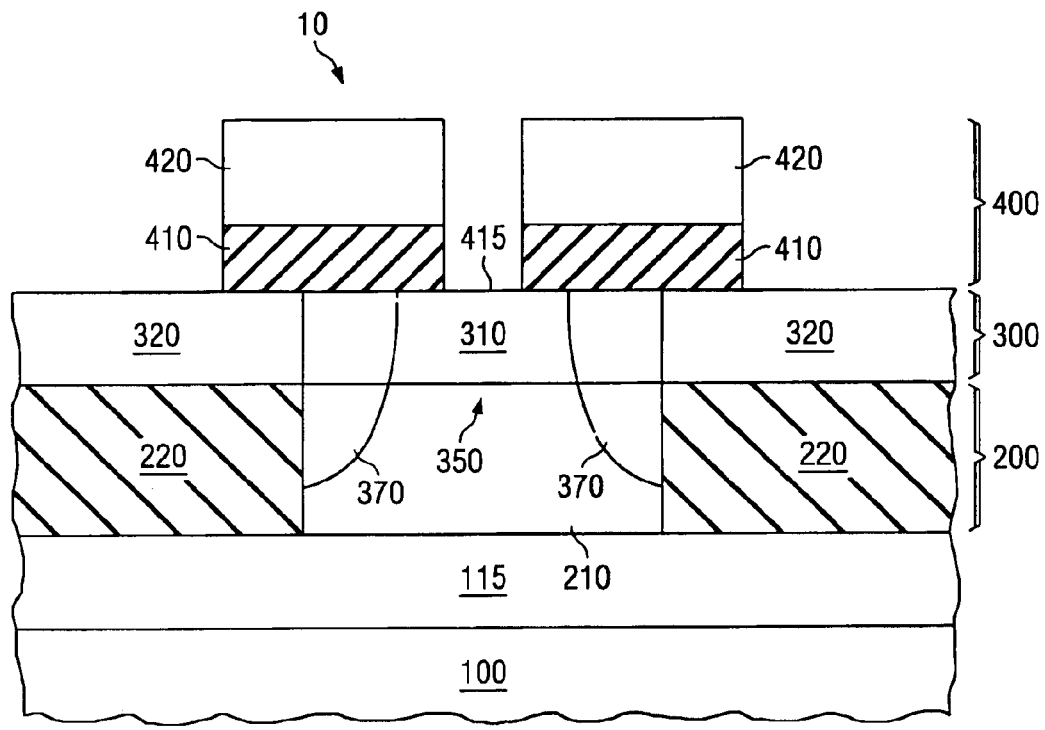
FIG. 5 is a cross-sectional depiction of a further partially completed JFET 10 embodying this invention.

FIG. 5 depicts a cross-sectional view of yet a further partially completed JFET 10 embodying this invention. Features depicted in FIG. 5 include a layer 400 that includes a photoresist pattern 420 and a dielectric layer 410. In this embodiment, the layer includes a silicon-nitride layer and a silicon-dioxide layer. Portion of layer 410 uncovered by the resist pattern is removed. With an etching technique well known in the art of semiconductor processing. The JFET may also be fabricated with a single oxide layer, or a single nitride layer, or an oxynitride layer in the place of the nitride-oxide layer combination 410 as depicted in FIG. 5.

Figure 6:
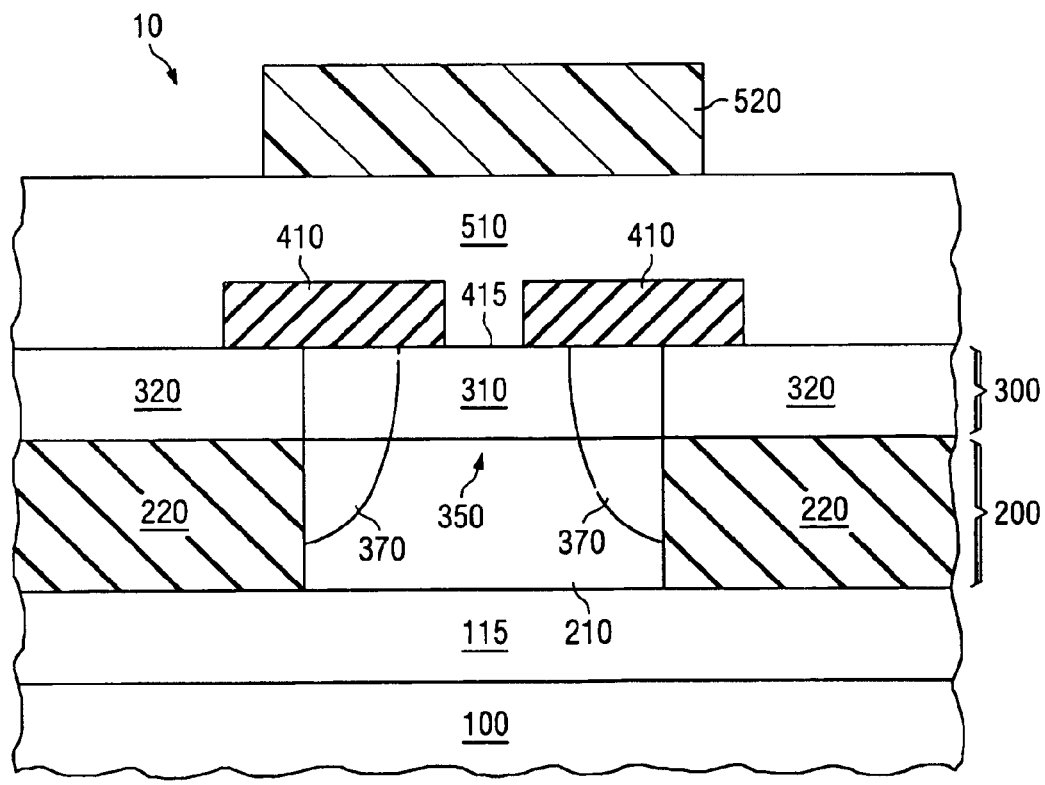
FIG. 6 is a cross-sectional depiction of a further partially completed JFET 10 embodying this invention.

FIG. 6 depicts a cross-sectional view of yet a further partially completed JFET 10 embodying this invention. Features depicted in FIG. 6 include a layer 510. In this embodiment layer 510 comprises polysilicon with a thickness between 1 kÅ and 3 kÅ, preferably 2 kÅ. At the vicinity of opening 415, where layer 510 contacts channel, the crystal may follow the crystalline structure of the channel region and remains mono-crystalline. FIG. 6 also depicts a photoresist pattern 520 that defines the source electrode area, as will be further illustrated in FIG. 7.

Figure 7:
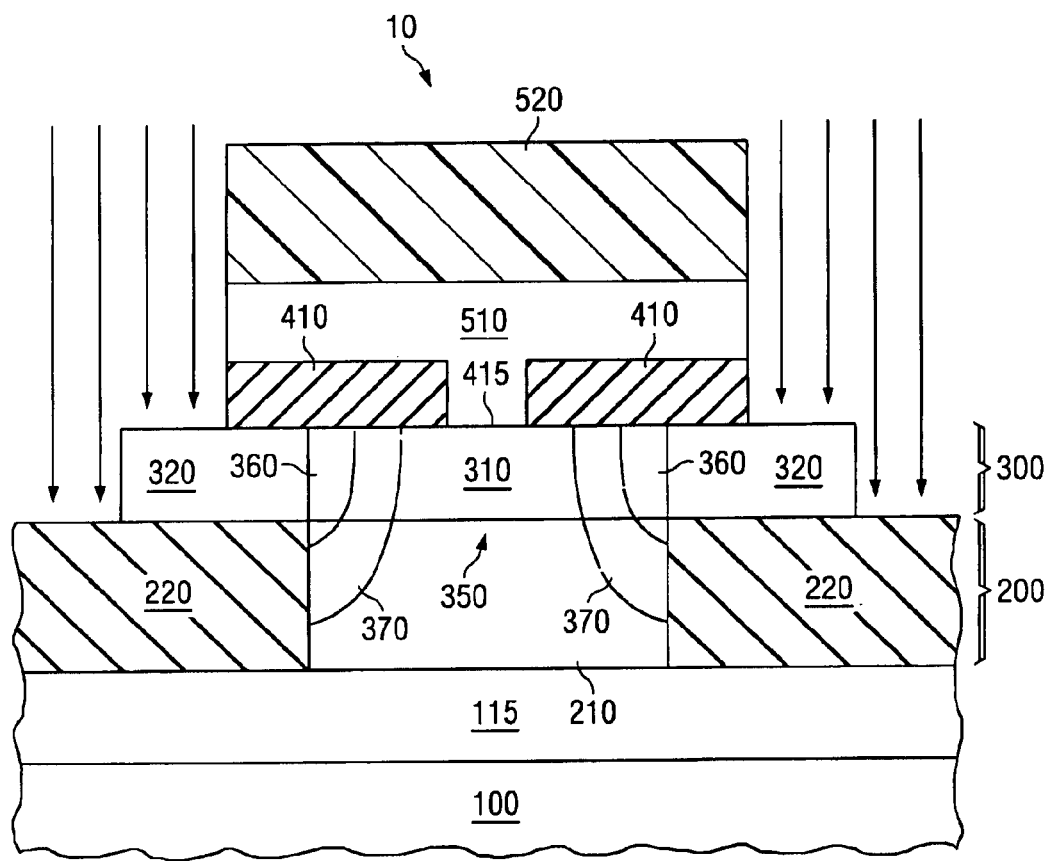
FIG. 7 is a cross-sectional depiction of a further partially completed JFET 10 embodying this invention.

FIG. 7 depicts a cross-sectional view of yet a further partially completed JFET 10 embodying this invention. Features depicted in FIG. 7 include a source element 510, gate elements 320, and p-type regions 360 and 370, and a channel region 350.

In this embodiment, the source element 510 and the gate elements 320 are formed with an etching process well known in the art of semiconductor processing. The etching removes the portion of layer 510 that is uncovered by the photoresist pattern 520, and the portion of layer 300 that is not under the dielectric element 410. With a change of etching chemistry following the polysilicon-etch, one further removes the portion of the dielectric element 410 that is uncovered by the source region 510. The removal of the dielectric element may be omitted if the thickness of the element 410 is sufficiently thin that allows sufficient dopant ions in an ion-implant process that follows to penetrate it.

The gate implant processes is depicted in FIG. 7 with arrows that point to the direction of the implanting. In this embodiment, the ion species is boron, the dose is $3 \times 10^{15}$ ions/cm$^2$, and the implant energy is 20 keV. Here, element 520 is depicted as a second application of the photoresist pattern that defines the source region. The second application of the pattern 520 is necessary because during the plasma etch process, the original photoresist erodes. And in order to prevent the boron ions from being implanted into the source region, one must protect the source region with an implant mask with sufficient stop power. If a suitable photoresist becomes available to serve both the patterning of the gate region and the blocking of the implant dopant, the second application of the pattern 520 would be unnecessary.

Because boron atoms diffuse relatively rapidly in polysilicon at elevated temperature, some of the boron atom will be driven from region 320 into the mono-crystalline regions 310 and 210 to form a pocket region 360. The double-boundary in FIG. 7 is for illustration purpose only as the dopant from the two implants would redistribute and may blur the physical boundary between them.

Not shown in FIG. 7 is the doping of the source region 510, which may be accomplished with a photoresist pattern that only uncovers the gate region 510. In this embodiment the implanted species is arsenic, the dose is $1.5 \times 10^{15}$ ions/cm$^2$, and the implant energy is 50 keV. Other implant species, dosages and energies maybe used to effect the source and gate implants.

Figure 1A:
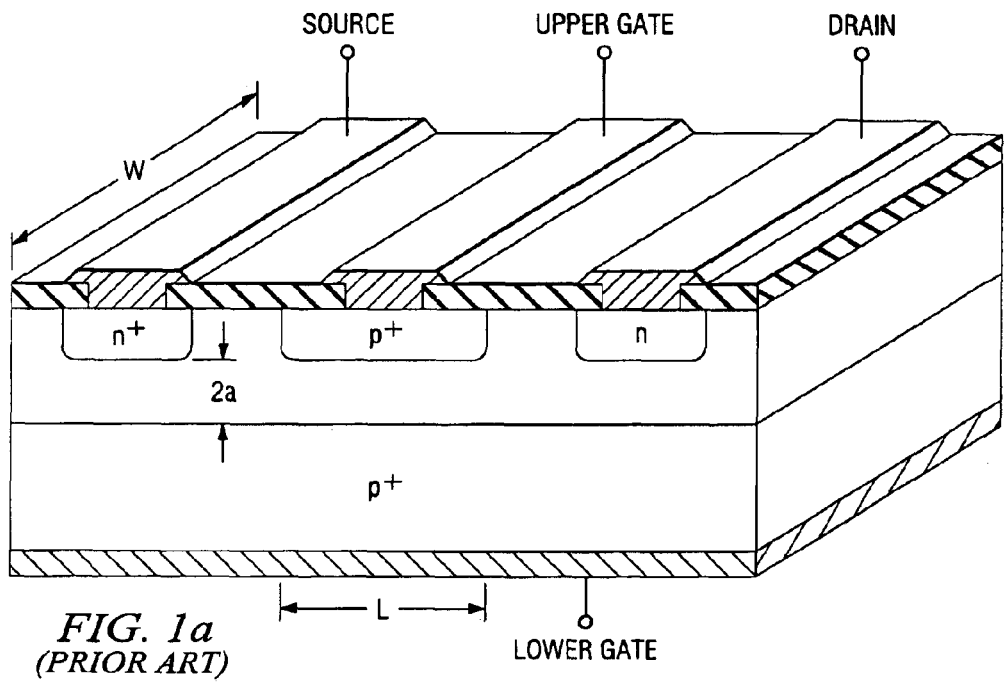
FIG. 1a is a partial sectional depiction of a semiconductor substrate with a JFET device built in it.
Figure 1B:
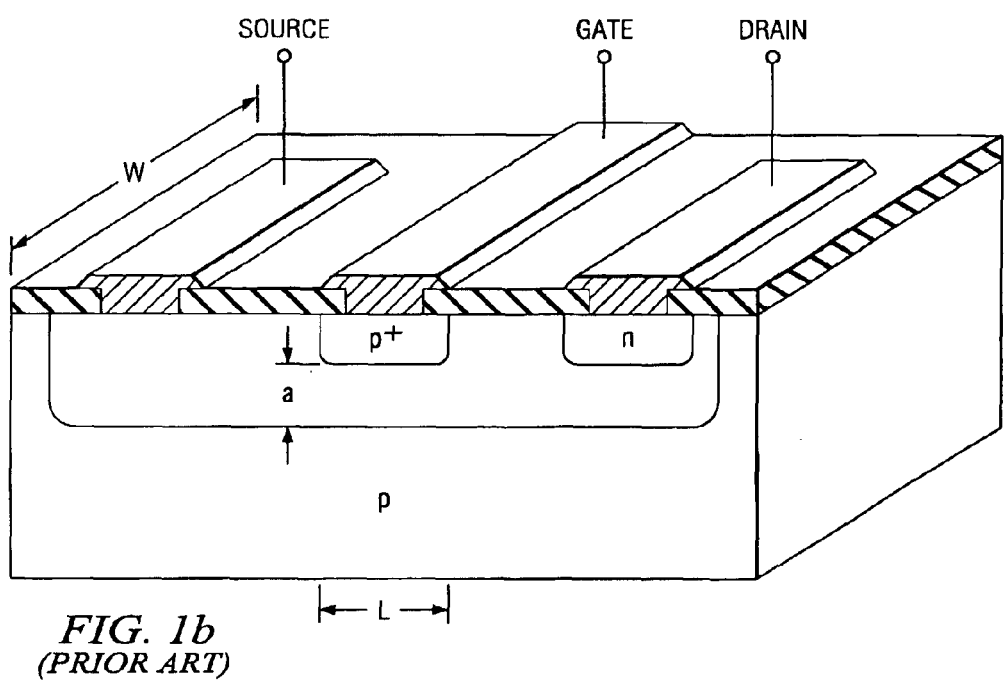
FIG. 1b is a partial sectional depiction of a semiconductor substrate with another JFET device built in it.
Figure 1C:
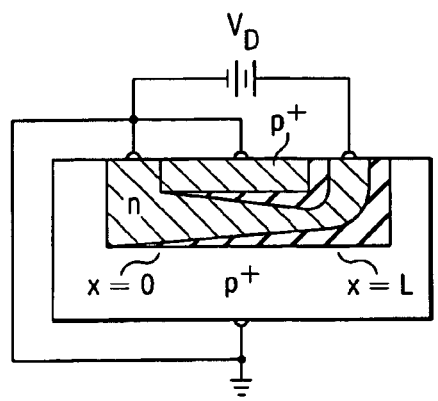
FIG. 1c is a schematical representation of a JFET.

Contrary to conventional JFETs depicted in FIGS. 1a, 1b, and 1c, in which the channel substantially runs parallel and proximate to the top surface of the semiconductor substrate, the JFET embodying this invention has a "vertical" channel that runs substantially perpendicular to the substrate surface. It is well known in the art of semiconductor physics that the top surface of the semiconductor substrate is heavily populated with imperfections such as charge traps and surface states. The interaction between the charge carrier in the channel and the surface imperfections is partially responsible for the performance limitation of conventional semiconductor devices in which the current flows parallel to and near the surface.

In contrast, the flow of the charge carriers in the "vertical" channel in the present invention is in a direction substantially perpendicular to the "surface" of the semiconductor surface. Thus the interaction between the charge carrier and the surface imperfection is substantially reduced, which enables the JFETs embodying this invention to have superior cutoff frequency ($f_{co}$) and 1/f noise figure.

What is claimed is:

1. An electronic device, comprising
   a. a substrate, having a top surface and a bottom surface;
   b. a buried layer near the top surface, doped with dopant of a first polarity, electrically communicable to a drain terminal;
   c. a body region, having a second top surface, a second bottom surface and a second side surface;
   d. a portion of the body region, having doped with dopant of a second polarity, contacting a gate region communicable to a gate terminal;
   e. a substantially uniformly doped channel region in the body region, having a third top surface, a third bottom surface, and a third side surface communicable to the portion of the body region in d., the third bottom surface being substantially coplanar to the second bottom surfaces and contacting the buried layer, the third top surface being substantially coplanar to the second top surface and contacting a source region; and
   f. the source region, projecting upward from the channel region, electrically communicable to a source terminal.

2. The electronic device in claim 1 in which the substrate is a semiconductor material.

3. The electronic device in claim 2 in which the semiconductor material is p-type silicon.

4. The electronic device in claim 1 in which the buried layer is n-type silicon material communicable to a drain terminal near the top surface through a sinker.

5. The electronic device in claim 1 in which the body region comprises two layers of substantially mono-crystalline n-type silicon layers.

6. The electronic device in claim 1 in which a portion of the body region distant from the second top surface contacts a dielectric region.

7. The electronic device in claim 6 in which the dielectric region comprises a silicon dioxide region formed with a STI technique.

8. The electronic device in claim 1 in which the gate region is substantially p-type polycrystalline silicon.

9. The electronic device in claim 1, in which an electrical current flows in the channel region upon a voltage bias being applied between the source terminal and the drain terminal.

10. The electronic device in claim 9, in which the electrical current flows in a direction substantially perpendicular the top surface of the substrate.

11. The electronic device in claim 9, in which the magnitude of the current is a function of a voltage at the gate terminal.

12. The electronic device in claim 1, in which the channel region is doped with n-type dopant.

13. The electronic device in claim 1, in which the channel region is doped with p-type dopant.

14. A semiconductor integrated circuit device, comprising:
   a. a semiconductor substrate, having a top surface and a bottom surface;
   b. a first layer of semiconductor material near the top surface, doped with a dopant of a first polarity, electrically communicable to a drain terminal near the top surface;
   c. a mono-crystalline first region, having a top surface, a bottom surface and a side surface, the lower portion of the side surface contacting an electrically insulating region, and the upper portion of the side surface coupling to a gate region communicable to a gate terminal near the top surface of the substrate;
   d. a substantially uniformly doped channel region in the first region, doped with dopant of the first polarity, having a top surface, a bottom surface, and a side surface, the top surface being substantially coplanar to the top surface of the first region, the bottom surface being substantially coplanar to the bottom surfaces of the first region and electrically communicable to the buried layer, the side surface coupling the gate region; and
   e. a source region, projecting upward from the channel region, having a top surface electrically communicable to a source terminal, a bottom surface electrically communicable to the top surface of the channel region.

15. The electronic device in claim 14, in which an electrical current flows in the channel region upon a voltage bias being applied between the source terminal and the drain terminal.

16. The electronic device in claim 15, in which the electrical current flows in a direction substantially perpendicular the top surface of the substrate.

17. The electronic device in claim 15, in which the magnitude of the current is a function of a voltage at the gate terminal.

18. The electronic device in claim 14, in which the distance between the top surface and the bottom surface of the channel region is about 0.7 micro-meters, in which about 0.5 micro-meter is attributable to a bottom layer and about 0.2 micro-meters is attributable to a top layer.

19. The electronic device in claim 14, in which the dopant of a first polarity is p-type.

20. The electronic device in claim 14, in which the dopant of a first polarity is n-type.

21. An n-channel silicon JFET, comprising:
   a. a silicon substrate, having a top surface and a bottom surface;
   b. a buried layer of mono-crystalline silicon near the top surface, doped with a n-type dopant to a sheet resistance of about 25 ohms per square, the buried layer being electrically communicable to a drain terminal near the top surface of the substrate;
   c. a silicon mono-crystalline first region having a top surface, a bottom surface and a side surface, the distance between the top and the bottom surfaces being about 0.7 micrometers, the lower portion of the side surface contacting a silicon dioxide region and the upper portion of the side surface contacting a p-type, poly-crystalline silicon gate region, a portion of the first region is p-type;
   d. the silicon gate region being communicable to a gate terminal near the top surface of the substrate;
   e. a substantially uniformly doped, n-type channel-region in the first region, having a top surface, a bottom surface, and a side surface, the top surface being substantially coplanar to the top surface of the first region, the bottom surface being substantially coplanar to the bottom surfaces of the first region and electrically communicable to the buried layer, the side surface contacting the p-type portion of the first region;
   f. a first n-type, poly-crystalline-silicon-source region, projecting upward from the channel region and the gate region, having a top surface electrically communicable to a source terminal near the top surface of the substrate, a bottom surface electrically communicable to the top surface of the channel region, a side surface in contact with dielectric side-wall spacers;
   g. the first n-type, poly-crystalline-silicon-source region in f. being electrically insulated from the first p-type, poly-crystalline-silicon-gate region.
   h. the device being operable channeling an electrical current through the channel region upon a voltage bias being applied between the source terminal and the drain terminal; and
   i. the electrical current flowing in a direction substantially perpendicular the top surface of the silicon substrate, the magnitude of the electrical current being a function of a voltage at the gate terminal.

* * * * *